(12) United States Patent
Goergen et al.

(10) Patent No.: US 12,099,340 B2
(45) Date of Patent: *Sep. 24, 2024

(54) METHOD AND APPARATUS FOR PROTECTION OF NETWORK DEVICE DURING INCREASE IN ENVIRONMENTAL CONTAMINATION

(71) Applicant: CISCO TECHNOLOGY, INC., San Jose, CA (US)

(72) Inventors: Joel Richard Goergen, Soulsbyville, CA (US); J. Scott Scheeler, Pleasanton, CA (US); Kameron Rose Hurst, Sonora, CA (US); Robert Gregory Twiss, Chapel Hill, NC (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 45 days.

This patent is subject to a terminal disclaimer.

(21) Appl. No.: 17/977,138

(22) Filed: Oct. 31, 2022

(65) Prior Publication Data

US 2023/0122663 A1   Apr. 20, 2023

Related U.S. Application Data

(62) Division of application No. 16/885,120, filed on May 27, 2020, now Pat. No. 11,526,143.

(51) Int. Cl.
*G05B 19/042* (2006.01)
*H05K 7/20* (2006.01)

(52) U.S. Cl.
CPC ..... *G05B 19/0428* (2013.01); *H05K 7/20736* (2013.01); *H05K 7/20836* (2013.01); *G05B 2219/21156* (2013.01)

(58) Field of Classification Search
CPC ...... G05B 19/0428; G05B 2219/21156; H05K 7/20181; H05K 7/20209; H05K 7/20736; H05K 7/20836
USPC ......................................................... 700/282
See application file for complete search history.

(56) References Cited

U.S. PATENT DOCUMENTS

| | | | |
|---|---|---|---|
| 5,774,331 A | 6/1998 | Sach | |
| 6,567,267 B1* | 5/2003 | Wang | H05K 7/20181 55/467 |
| 6,780,216 B2* | 8/2004 | Kiilunen | B01D 46/0004 416/247 R |
| 6,974,489 B2 | 12/2005 | Behrens et al. | |
| 7,164,840 B2 | 1/2007 | Hsieh | |
| 9,883,610 B1 | 1/2018 | Beall et al. | |
| 9,977,193 B2 | 5/2018 | Abe | |
| 10,090,623 B2 | 10/2018 | Campschroer | |
| 10,763,606 B1 | 9/2020 | Esmaily et al. | |
| 11,526,143 B2* | 12/2022 | Goergen | H05K 7/20836 |
| 2010/0182748 A1 | 7/2010 | Huang | |
| 2013/0278120 A1 | 10/2013 | Elkins | |
| 2016/0062340 A1 | 3/2016 | Ogawa et al. | |

(Continued)

*Primary Examiner* — Chun Cao

(57) ABSTRACT

In one embodiment, a method includes initiating a protection mode at a network device having a protective cover installed to filter airflow entering a network device, reducing one or more of a fan speed, processing functions, or power at the network device, exiting the protection mode upon removal of the protective cover from the network device, and increasing one or more of the fan speed, the processing functions, or the power to resume normal operation at the network device.

20 Claims, 7 Drawing Sheets

(56) References Cited

U.S. PATENT DOCUMENTS

2017/0347496 A1    11/2017   Smith
2019/0332149 A1    10/2019   Shelnutt et al.

\* cited by examiner

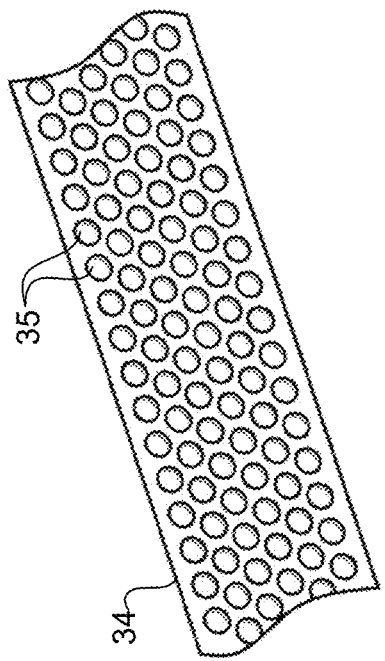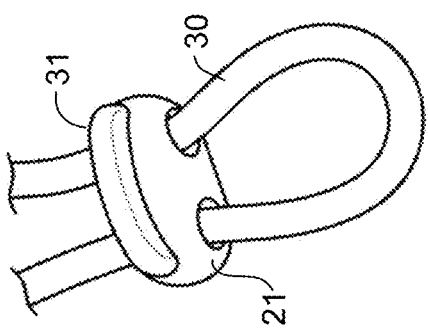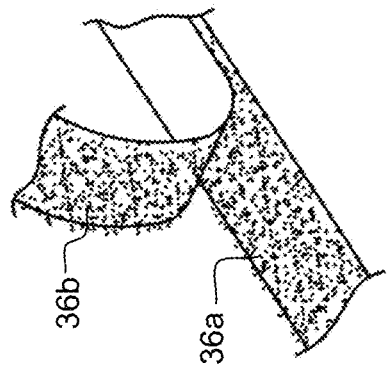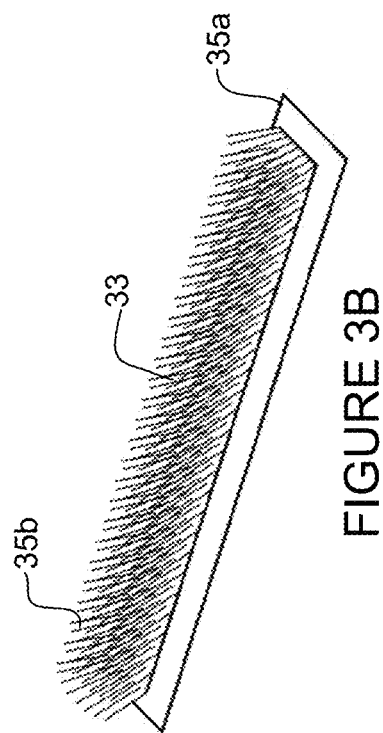

METHOD AND APPARATUS FOR PROTECTION OF NETWORK DEVICE DURING INCREASE IN ENVIRONMENTAL CONTAMINATION

STATEMENT OF RELATED APPLICATIONS

The present application is a divisional of U.S. patent application Ser. No. 16/885,120, filed May 27, 2020, the entire contents of which are incorporated herein by reference.

TECHNICAL FIELD

The present disclosure relates generally to electronic equipment such as network devices, and more particularly, to protecting the electronic equipment from contamination.

BACKGROUND

Network communication systems utilize network devices that include complex and sensitive electronic components. The network devices are typically designed to operate in a controlled environment such as data centers and central offices with controlled temperature, humidity, and air quality. However, during construction or other environmental disruptions, the network devices may be exposed to a higher risk of contamination.

BRIEF DESCRIPTION OF THE DRAWINGS

FIG. 3A illustrates a drawstring cinch for sealing the protective cover, in accordance with one embodiment.

FIG. 3B illustrates a cinch dust barrier for use in providing additional protection, in accordance with one embodiment.

FIG. 3C illustrates a portion of an elastic band with silicone grips for use in mating the protective cover with the network device, in accordance with one embodiment.

FIG. 3D illustrates a Velcro strip that may be used in closing and opening the protective cover for installation and removal of the protective cover, in accordance with one embodiment.

Corresponding reference characters indicate corresponding parts throughout the several views of the drawings.

DESCRIPTION OF EXAMPLE EMBODIMENTS

Overview

Figure 1:
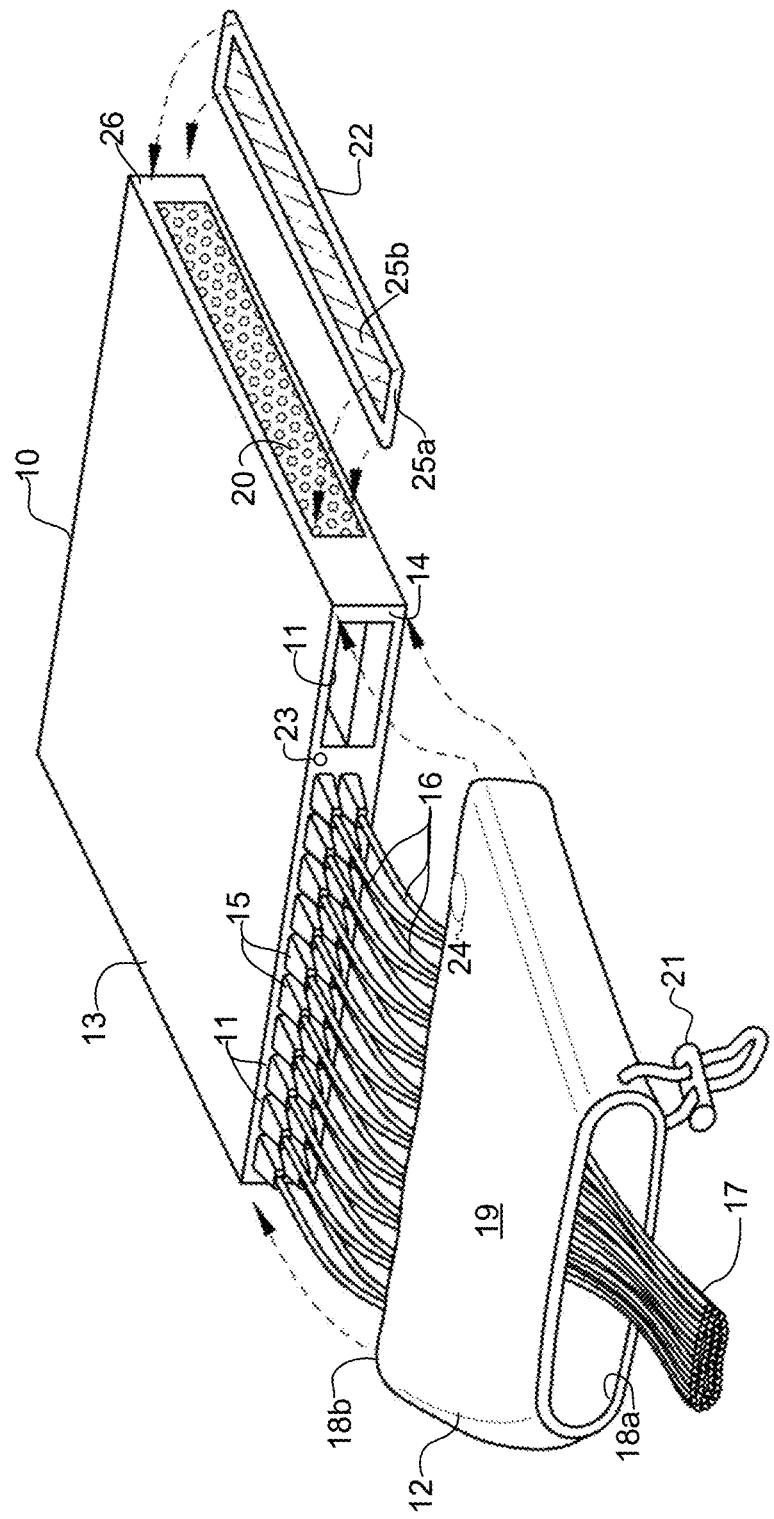
FIG. 1 illustrates protective covers positioned for placement on a network device, in accordance with one embodiment.

In one embodiment, a method generally comprises initiating a protection mode at a network device having a protective cover installed to filter airflow entering the network device, reducing one or more of a fan speed, processing functions, or power at the network device, exiting the protection mode upon removal of the protective cover from the network device, and increasing one or more of the fan speed, the processing functions, or the power to resume normal operation at the network device.

In another embodiment, an apparatus generally comprises a removable protective cover for installation on a face of a network device comprising a plurality of ports coupled to a plurality of cables, the cover comprising a filter material defining a first opening at a first end for engagement with the cables coupled to the network device and a second opening for positioning adjacent to the face of the network device. The protective cover filters airflow entering the face of the network device during a period of increased environmental contamination with the network device operating in a protection mode with reduced airflow.

In yet another embodiment, an apparatus generally comprises a network device having a face comprising a plurality of ports coupled to cables for transmitting power, a protective cover installed adjacent to the face of the network device with the cables passing through the cover, and a controller for reducing one or more of a fan speed, processing functions, or power at the network device with the protective cover installed. The protective cover filters airflow entering the face of the network device during a period of increased environmental contamination.

Further understanding of the features and advantages of the embodiments described herein may be realized by reference to the remaining portions of the specification and the attached drawings.

EXAMPLE EMBODIMENTS

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

Electronic equipment such as network communication devices may be used in environments that may temporarily have different conditions than a typical environment in which contaminants present in the air may be easily filtered. In most installations, a rack or cabinet used to contain the network device has no environmental protection and the network device is directly exposed to ambient air. In one example, the network device (e.g., switch or router) may provide power (e.g., PoE (Power over Ethernet), FMP (Fault Managed Power) (higher power operation with fault detection), or ESP (Extended Safe Power) (higher power operation with pulsed DC (Direct Current) power or multi-phase pulse power)) that is used during construction to power systems such as standard lighting, emergency lighting, control systems, HVAC (Heating, Ventilation, and Air Conditioning) systems, or any other system.

During construction or events such as storms or other temporary environmental disruptions, the equipment may be exposed to severe dust or other contamination (e.g., particulate, moisture, abrasive chemicals) for a period of time (e.g., days, weeks, months, or in some cases longer). Electronic equipment is typically not designed for this type of harsh environment and exposure to increased contaminants may harm the equipment and impact reliability. For example, deployment of network devices in the presence of uncontrolled contamination in cooling air may lead to damage to electronic components, cooling fans, and mechanical enclosures. Failure of the network device or components may occur very quickly in an uncontrolled environment. Although all types of electronic equipment face these issues, the severity of the failure may be higher for air cooled equipment due to the flow of contaminated air within product enclosures. Since these failures are often not recoverable, the downtime associated with these failures may be significant.

The above described failures may occur even if an internal dust filter is used in the network device, since the internal filter would not filter out moisture or a large amount of dust particles. The limited space available in network devices typically does not allow for a larger filter, which would consume significant space needed for electronics. The space limitations within the network device thus prevent the use of an internal filtration system that would filter out contaminants present in an uncontrolled environment.

The embodiments described herein provide methods and apparatus to prevent contamination of electronic equipment during temporary environmental disruptions. As described in detail below, one or more protective covers (filters) may be temporarily attached to the equipment to filter air entering the equipment. The embodiments provide improved reliability by avoiding failure of electronic components (e.g., electronic circuits, circuit boards, chips, wiring, memory, processors), mechanical components (e.g., fans, power units, interfaces, connectors), or any other internal component.

In one or more embodiments, a protective cover may be attached to a face (e.g., front face) of a network device comprising a plurality of ports coupled to cables for transmitting power and seal around the cables connected to the network device to filter air or limit the amount of air entering the face of the network device. The protective cover may be used to filter airflow entering the network device during a period of increased environmental contamination. In one or more embodiments, a cover may also be attached to an air inlet side of the network device. As described in detail below, the network device may be placed in a protection mode in which one or more functions of the network device (e.g., fan speed, processing functions, switching functions, power output) may be minimized. The protection mode may be initiated by a software command (e.g., CLI (Command Line Interface)) or automatically initiated upon attachment of the protective cover to the network device.

A contaminant prevention system described herein may be used with any type of electronic system or device to protect it from failure due to dust, moisture, chemical particles, or any other airborne particles or harmful contamination. Thus, it is to be understood that the term "network device" as used herein may refer to any electronic device or component in which the protective cover and protection mode described herein may be used to at least temporarily filter air entering the device and prevent damage from contaminants present in the air. For example, the term "network device" may refer to a switch, router, or any other electronic device, component or equipment operable to provide power to systems (e.g., lighting, HVAC, or other systems) that may be needed during environmental disruptions in which the possibility of damage to the equipment due to contamination is increased, and the network device may or may not provide data communications. The network device may comprise one or more fans for providing airflow within the network device, or the network device may comprise air vents for cooling without the use of fans or may use liquid cooling.

Referring now to the drawings, and first to FIG. 1, a network device 10 is shown with a removable protective cover (boot) 12 aligned for placement on the network device. In the example shown in FIG. 1, the network device comprises a chassis 13 having a face place 14 comprising a plurality of openings (ports) 11 for receiving components (e.g., connectors (plugs, jacks) 15 (coupled to cables 16)) for transmitting or receiving power, data, or power and data. For example, the network device 10 may comprise any number of PoE (Power over Ethernet), PoE+, UPOE (Universal Power over Ethernet), UPOE+, ESP, FMP, or USB (Universal Serial Bus) ports, optical module ports for receiving pluggable optical modules (transceiver modules) (e.g., SFP (Small Form-Factor Pluggable), QSFP (Quad Small Form-Factor Pluggable), QSFP+, QSFPDD (QSFP Double Density), OSFP (Octal Small Form-Factor Pluggable), and the like), ports for receiving modular uplinks (comprising any number of ports (slots)), or any other port or combination of ports in any arrangement. The cables 16 may be configured for transmitting power, data (electrical, optical), cooling, or any combination thereof and may be combined into a cable bundle 17 (e.g., cat 5/6 (category 5, category 6)) cabling bundle. In one example, if there are open ports 11 on the face 14 of the network device 10, caps may be inserted into the ports. For example, an optical module plug may be installed in any open optical module port or an RJ cap may be installed in any open RJ45 connector.

Figure 2:
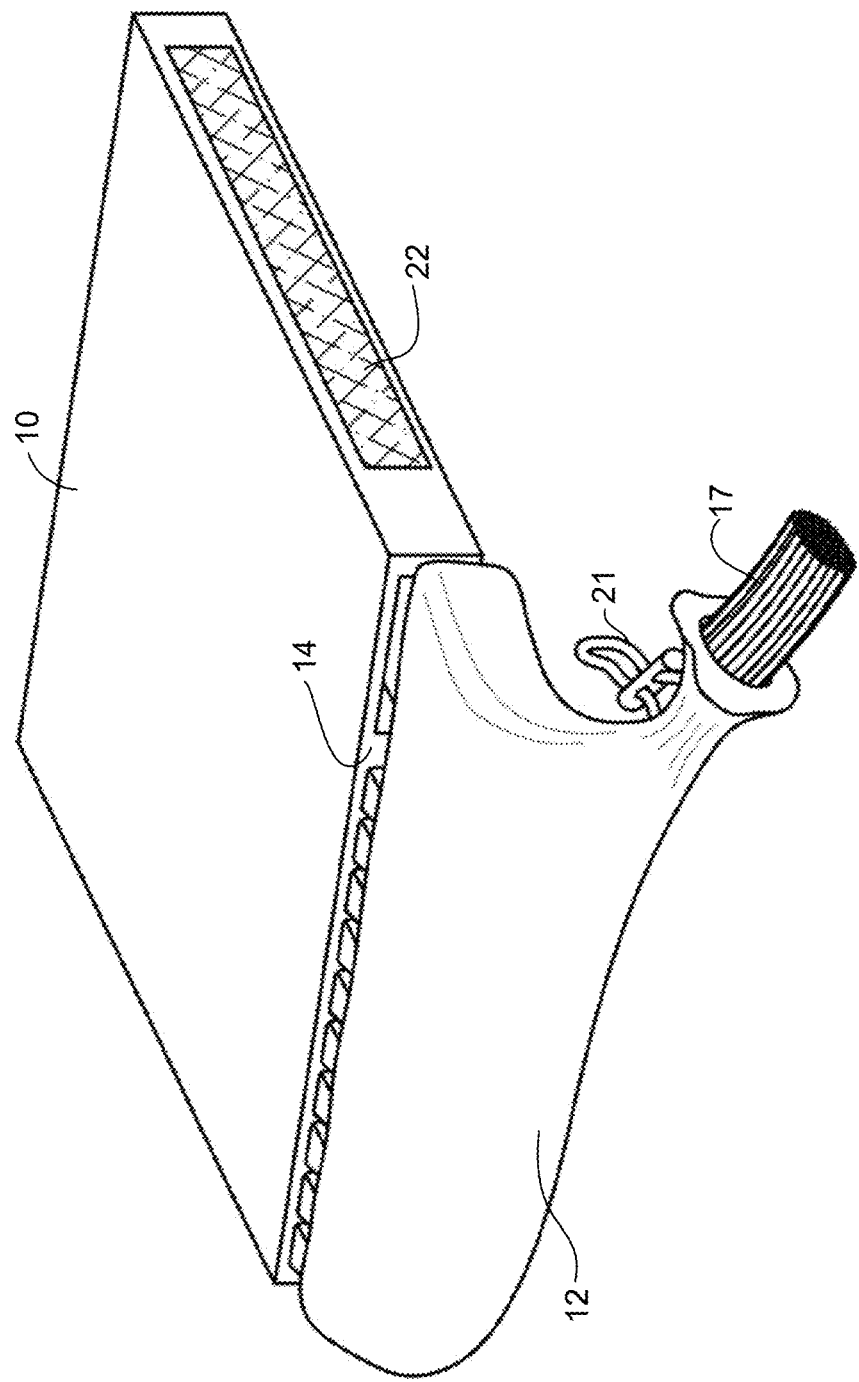
FIG. 2 illustrates the protective covers installed on the network device.

The protective cover 12 is installed adjacent to the face 14 of the network device 10. In order to filter airflow entering the face 14 of the network device, the protective cover 12 is placed over the face (or at least a portion thereof comprising the ports 11 or other openings) to prevent contamination of the network device during construction or other environmental disruption with an increased risk of contamination. The cover 12 comprises a filter material (e.g., substantially inelastic or elastic fabric, flexible cloth) 19 arranged in a generally tubular shape (e.g., tube with varying diameter, tapered tube, conical shape with truncated end) and defining openings 18a, 18b at each end to allow the cables 16 (cable bundle 17) to pass therethrough. The first opening 18a engages with the cable bundle 17 when sealed (as shown in FIG. 2) and the second opening 18b is positioned adjacent to the face 14 of the network device 10. The first opening 18a has a smaller diameter than the second opening 18b and can be reduced in diameter once installed to seal against the cable bundle 17 (FIGS. 1 and 2). The first opening 18a comprises a draw string and cinch 21 (FIGS. 1 and 3A) or other suitable device (e.g., zip tie) for gathering the material 19 at the opening 18a to seal against the cable bundle 17. In one or more embodiments, a cinch dust barrier (described below with respect to FIG. 3B) may be located at the first opening 18a to create a dust barrier between the cover 12 and cable bundle 17. As described below with respect to FIG. 3C, the second opening 18b may comprise an elastic strip with silicone grips for mating with the network device 10. The cover 12 may also include a sealable opening extending between the first and second openings 18a, 18b to allow for installation and removal of the cover without removing the cables from the network device 10, as described below with respect to FIG. 4. Cover 12 may also include internal or external features (not shown) such as straps (e.g., elastic or Velcro) or sewed conduits to help organize and segregate cables 16 within cable bundle 17. Furthermore, these features may be used to help fix cover 12 in place conveniently during sealing or unsealing opening operations.

In one or more embodiments, the network device 10 may include a plastic strip framing the front face for engagement with the cover, with the plastic strip being easily removed from the network device after the cover 12 is removed. In another example, the protective cover 12 may magnetically attach to the chassis (e.g., chassis made of metal that attracts magnets or magnetic strip attached to chassis). Clips, snaps, or Velcro may also be used to attach the cover 12 to the network device 10.

The network device 10 may further include one or more fans and power supply units (not shown). In one or more embodiments an air inlet cover 22 (external filter) is positioned adjacent to an air inlet 20 on an air inlet side 26 of the network device 10 to filter air circulated through the device by the fan and protect internal components of the device from chemical corrosion or damage from moisture, dust, or any other contaminants. The air inlet cover 22 is positioned over the air inlet 20 (as shown in FIG. 2) and removably attached to the network device 10 to provide additional filtration. The air inlet cover 22 shown in FIG. 1 comprises a frame 25*a* and a filter 25*b* comprising a high performance filtration media, which may be much thicker than a conventional internal air filter included in a fan tray, due to special coatings needed to trap and filter the contaminants. The air inlet cover frame 25*a* may comprise, for example, a magnetic material for attaching to a chassis formed of a material that attracts magnets. The magnets may also serve to attract and hold ferritic debris, such as discarded fasteners (e.g. screws and nails), and fabrication debris (e.g. metallic chips or dust), further preventing their entry into network device 10. Other types of attachment means may be used (e.g., Velcro, low-tack (e.g. "fugitive") and pressure-sensitive adhesive, semi-adhesive material). It is to be understood that the air inlet cover 22 is optional and the protective cover 12 may be used on its own without the air inlet cover if the internal fan filter is sufficient to filter out contaminants.

The filtration media of the protective cover 12 or air inlet cover 22 may be operable to filter dust, moisture, chemical particles, or any combination of these or other contaminants present in the air, and may comprise different types, shapes, or widths of material depending on the filtration needed for a particular environment and the space available with the network device installed in a rack or cabinet or other enclosure with any number of other network devices. Furthermore, the filter may be treated with chemical compounds to react with and reduce the effects of adverse or corrosive air components (e.g. sulfur oxides). The filtration media may comprise, for example, a particulate filter to filter out dust or a hydrophobic filter to address moisture. The level of filtration provided by the cover may be selected based on an environment in which the cover is to be used. In some cases, the cover 12 may comprise a material providing high filtration (e.g., minimal or no airflow). The cover 12 may include, for example, instructions for initiating protection mode at the network device or another image (e.g., branding, logo) positioned in a viewable location. As shown in FIGS. 1 and 2 and described herein, the cover 12 is positioned adjacent to the face 14 of the network device 10 comprising ports 11 for coupling to the cables 15. Therefore, the cover 12 can easily be installed on one or more network devices stacked in a rack, even with minimal spacing between network devices. In one or more embodiments, the protective cover may be configured to protect multiple network devices. For example, the protective cover may be sufficiently large to extend over multiple faces of adjacent network devices and allow multiple cable bundles to pass therethrough. Different sized covers may be used to cover various size network devices. For example, the protective cover may be configured to cover 1 RU (rack unit) to 22 RU devices for use on 19 inch, 23 inch, or any other width racks. If there is access to an upper surface of the chassis, the cover may be configured to attach to the upper surface along an edge margin adjacent to the front face 14 and then extend out away from the front face to create a sealed enclosure surrounding the ports 11 on the front face.

Once the cover (protective cover 12, air inlet cover 22, or both) is installed on the network device 10, as shown in FIG. 2, a protection controller (software, logic) may minimize heat generating operations (e.g., processing functions, switching functions, power output) and minimize (or stop) fans to limit airflow within the device (described below with respect to FIGS. 6 and 7). For example, the controller may reduce one or more of fan speed, processing functions, or power at the network device 10 with the protective cover 12 installed. In one or more embodiments, the network device 10 may include a sensor or button 23 (e.g., located on front face 14 as shown in FIG. 1 or any suitable location) that provides an indication that the cover is installed (or being installed) to the controller so that it may initiate protection mode. The sensor 23 may comprise, for example, a magnetic switch, mechanical switch (micro switch, electromechanical switch), RFID (Radio-Frequency Identification) device, NFC (Near Field Communication) device, optical sensor, airflow sensor, or any other suitable device operable to detect installation or removal of the protective cover 12 and send a signal to the controller. The cover 12 may comprise a sensor interface 24 (e.g., magnet, RFID tag, mechanical element) operable to indicate to the sensor 23 located on the network device installation or removal of the protective cover 12. For example, an RFID tag may be attached to the cover 12 and the sensor 23 may comprise an RFID reader. In another example, the sensor interface may comprise a plug (e.g., RJ45 plug) that is inserted into an open port to indicate installation of the protective cover 12. The sensor or switch 23 provides electrical input to the protection module (controller), which may use this information to begin the process of reducing operating functions and fan speed, as described below. It is to be understood that the type or location of the sensor 23 and sensor interface 24 shown in FIG. 1 and described herein is only an example and that other types of sensors, switches, or sensor interfaces or mounting locations may be used without departing from the scope of the embodiments.

It is to be understood that the network device 10 shown in FIGS. 1 and 2 and described above is only an example, and the arrangement or type of components, connectors, and cables may be different than shown. For example, the cables may exit from the network device in any direction and may form any number of cable bundles. In addition to the cable bundle 17 shown in FIG. 1, cables may also exit to the right, to the left, or all three directions.

Also, it is to be understood that the protective cover 12 shown in FIGS. 1 and 2 and described above is only an example and the cover may comprise different materials, shapes, or sealing components, without departing from the scope of the embodiments. For example, as described below with respect to FIGS. 4 and 5, the protective cover may include a sealable opening extending between the first and second openings for installation and removal of the cover with the cables coupled to the network device. As described below, the protective cover may include additional openings for cables exiting in different directions. Also, while the protective cover shown and described herein is configured for removal once the risk of contamination is no longer present, in one or more embodiments, the cover may be attached to the chassis in a position removed from the front face (e.g., rolled up or folded out of the way) and pulled out for positioning over the cables and openings as needed.

It is to be understood that the terms front, rear, downward, upward, lower, upper, right, or left as may be used herein are only relative terms and that the network device may have ports or an air inlet located on any face. For example, the term "front face" as used herein refers to an exposed or accessible side of the chassis in which ports are located.

FIGS. 3A-3D illustrate examples of accessories that may be included with the protective cover for sealing the cover, closing the cover, or mating the cover with the network device. Referring first to FIG. 3A, an example of the draw string and cinch 21 of FIGS. 1 and 2 is shown, in accordance with one embodiment. The draw string may comprise an elastic cord 30 sewn into one end of the cover 12 (at to opening 18a as shown in FIG. 1) and a clip (cinch) 31 for tightening the cord to create a seal between the cover and cable bundle 17.

FIG. 3B illustrates an example of an optional cinch dust barrier 33 that may be used to provide additional protection at the cover to cable interface at the opening 18a when the cover is closed (FIGS. 1 and 2). The dust barrier 33 may comprise a flexible strip 35a attached to an inner edge of the cover with thin flexible fingers 35b extending inward therefrom to filter out contaminants.

FIG. 3C illustrates an example of an elastic strip 34 with silicone bumps (grips) 35 that may be attached to the cover for engagement with the network device. As previously described with respect to FIG. 1, the elastic strip 34 (or a magnetic strip) positioned at the second opening 18b of the cover may seal against the face 14 of the network device or an edge margin of one of the other surfaces of the chassis (e.g., top, bottom, side).

FIG. 3D illustrates an example of Velcro strips 36a, 36b that may be easily engaged and disengaged for opening and closing the cover for removal or installation, as described below with respect to FIG. 4. The Velcro strips 36a, 36b may also be used at a side opening for cables exiting towards a side of the network device to allow the cables to pass therethrough (rather than through the central opening 18a). It is to be understood that Velcro is only one example and other closure means may be used, including for example Ziploc type closures.

Figure 4:
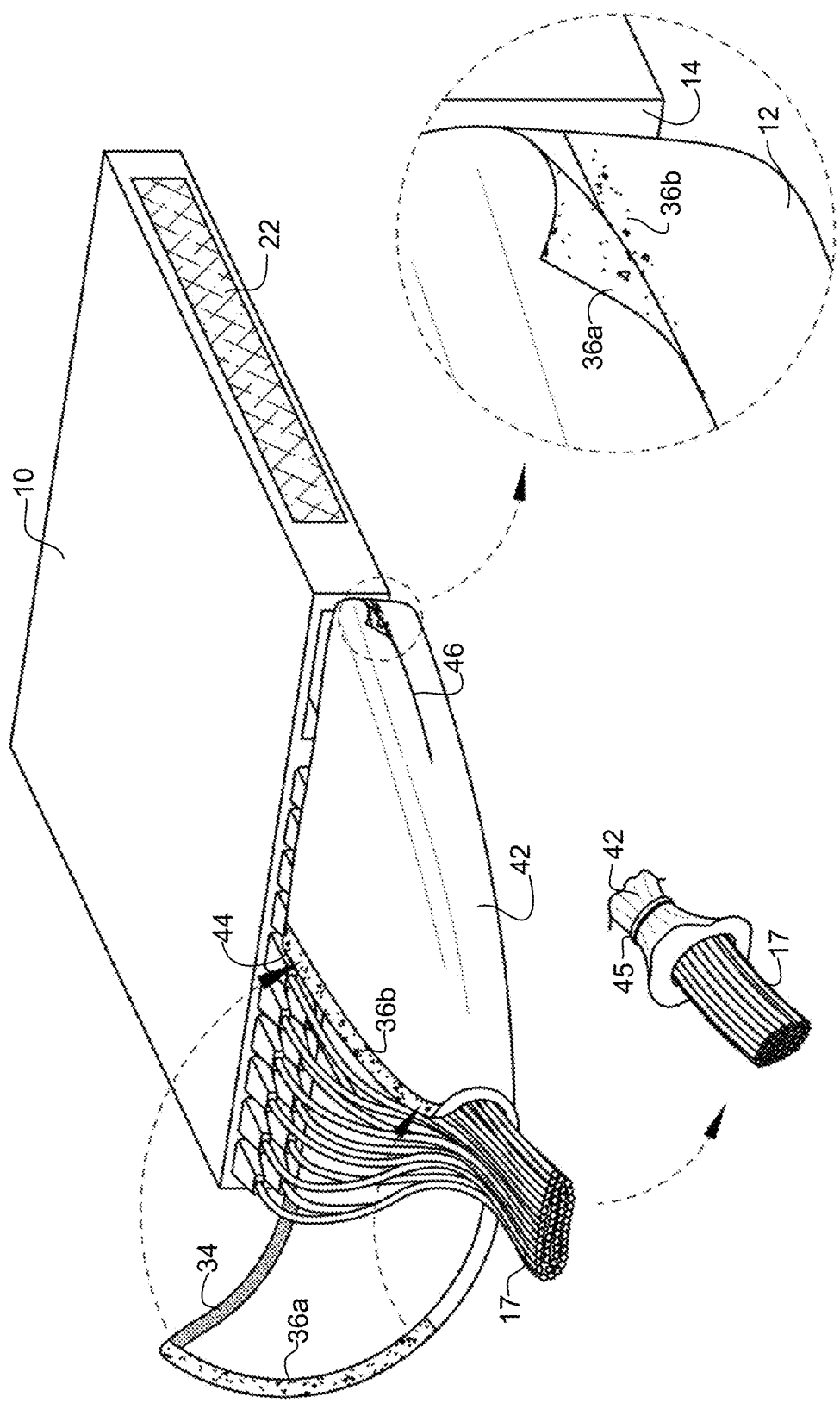
FIG. 4 illustrates another example of a protective cover, in accordance with one embodiment.

FIG. 4 illustrates a protective cover 42 attached to the network device 10, in accordance with one embodiment. In this example, the cover 42 includes a resealable opening 44 comprising the Velcro strips 36a, 36b shown in FIG. 3D. In this example, the cover 42 may be positioned below the cables in an open position and then wrapped around the cables to bring the two pieces of fabric together at the Velcro strips 36a, 36b. While the sealable opening 44 is shown positioned on a top of the protective cover 42, it is to be understood that the opening may extend along a side or bottom of the cover. In the example shown in FIG. 4, a zip tie (cable tie) closure 45 is used to cinch the opening around the cable bundle 17. The zip tie 45 is wrapped around the cover 42 and cable bundle 17 after the cover has been positioned on the network device 10. As shown in FIGS. 1 and 3A, a draw string and cinch type closure 21 may also be used. As described above, an elastic strip 34 (FIG. 3C), magnetic strip, or clips (e.g., snap fasteners) may be used to engage the protective cover with the network device.

As previously noted, one or more cables or cable bundles may exit towards a side of the cover 42. As shown in FIG. 4, the cover 42 may include another cable opening 46 on one or both sides of the cover. The opening may comprise, for example, a slot (split in fabric) with mating Velcro pieces 36a, 36b on overlapping material on edge margins of the slot. Once the cables pass through the opening 46, the sides are sealed around the cables using the Velcro fastener.

Figure 5:
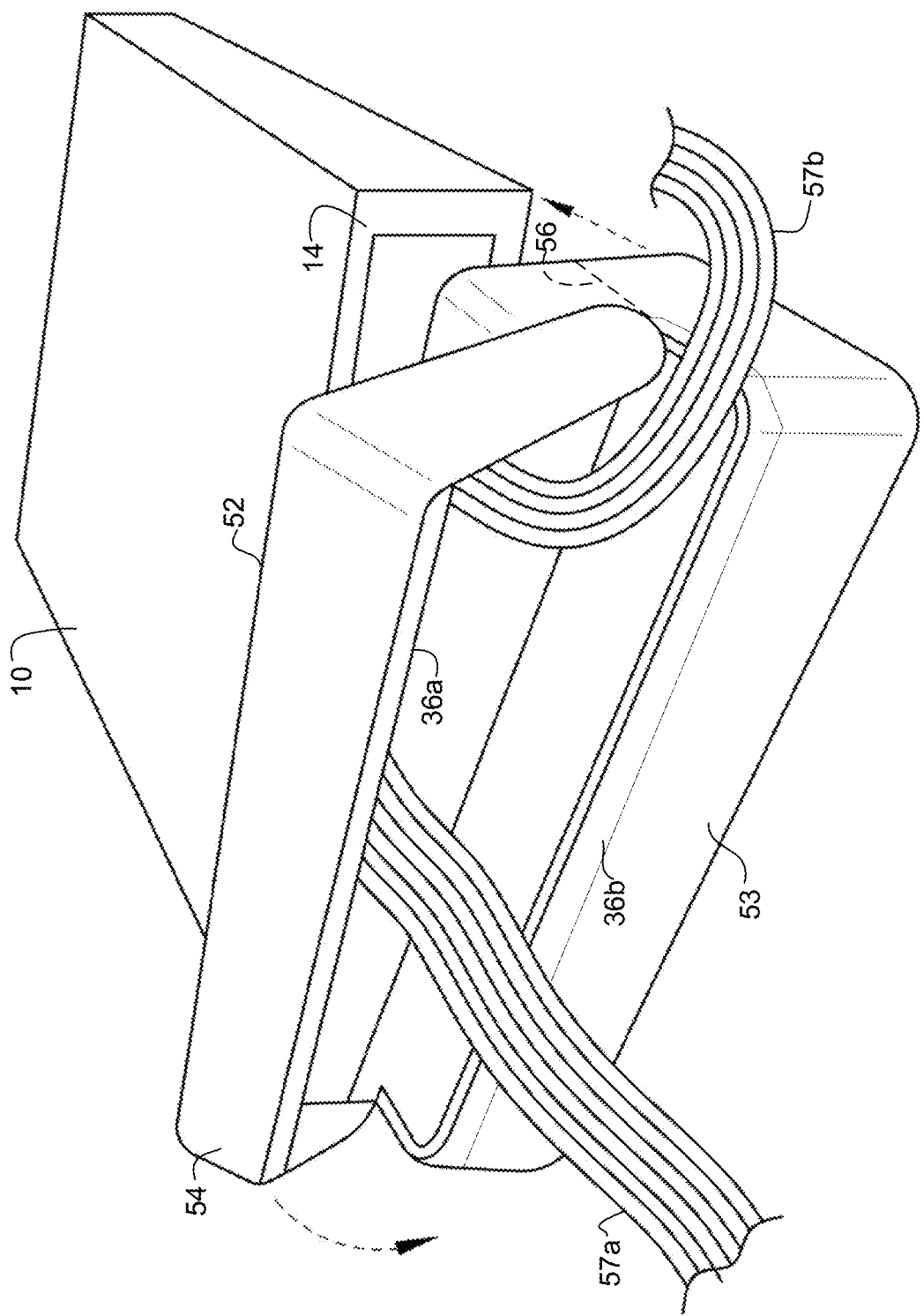
FIG. 5 illustrates yet another example of a protective cover, in accordance with another embodiment.

FIG. 5 illustrates another example of a protective cover 52 for attachment to the network device 10, in accordance with another embodiment. The cover 52 comprises a lower portion 53 and an upper hinged portion 54. The cover 52 is formed from a flexible material (e.g., nylon, vinyl) so that the upper portion 54 can be closed over the cable bundles 17 without damaging the cables. An internal surface of the upper portion 54 and an external surface of the lower portion 53 may comprise Velcro strips 36a, 36b along mating edge margins. The protective cover 52 may also include a sealable (e.g., Velcro opening) 56 on one side so that the cover 54 may be installed over existing cables and removed without removing cables. As shown in FIG. 5, one of the cable bundles 57a may exit outward from the front face 14 of the network device and another cable bundle 57b may exit towards a side of the network device.

Figure 6:
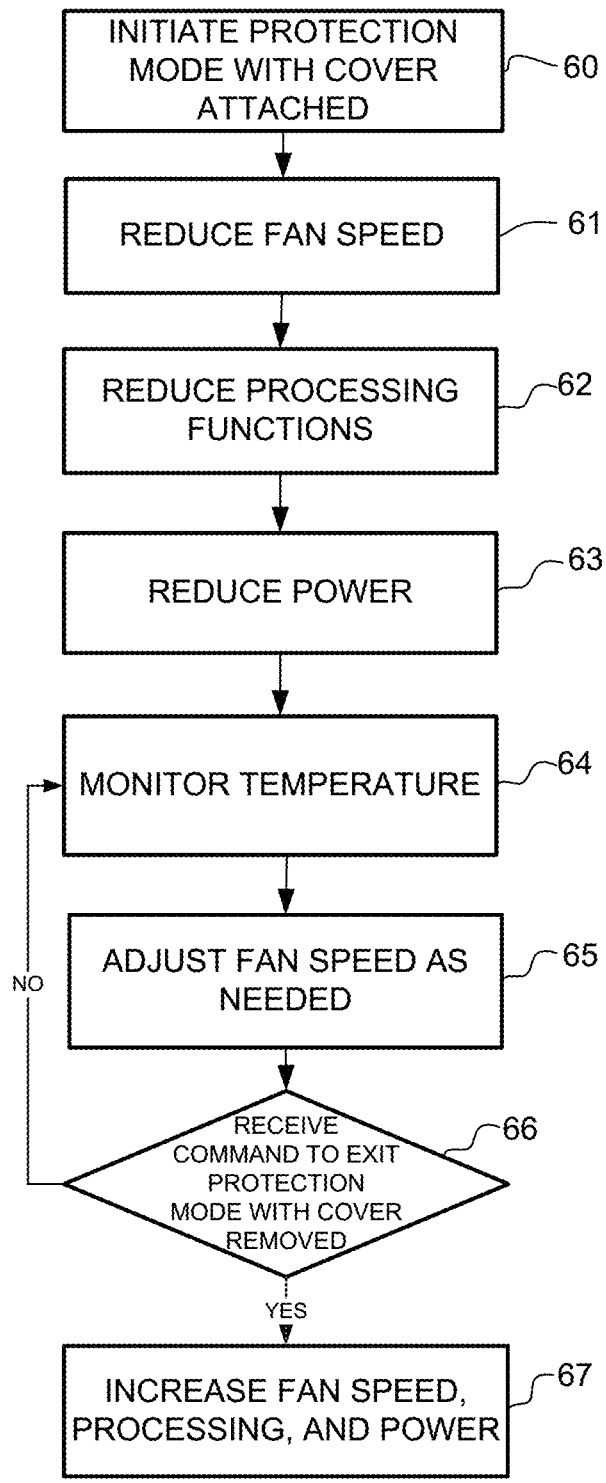
FIG. 6 is a flowchart illustrating a process for preventing contamination of electronic equipment during environmental disruptions, in accordance with one embodiment.

FIG. 6 is a flowchart illustrating an overview of a process for operating the network device 10 in protection mode with the protective cover 12 installed (FIG. 2), in accordance with one embodiment. At step 60, protection mode is initiated with the protective cover 12 installed to filter airflow entering the face 14 of the network device 10 comprising a plurality of ports 11 coupled to cables 16 with the cables passing through the protective cover (FIGS. 2 and 6). As previously described, the protection mode may be initiated upon detection at the sensor 23 of installation of the protective cover 12 at the network device 10, activation of a switch at the network device, or a first (initiate) command received at the network device (FIGS. 1 and 6). Also, as previously noted, the air inlet cover 22 may also be installed. The protection controller may then reduce one or more of fan speed (step 61), processing functions (step 62), or power (step 63) at the network device 10. These steps may be performed simultaneously or in any order. Also, any combination of these or other operating functions may be modified. The processing functions (e.g., CPU (Central Processing Unit) functions, switching functions, enterprise functions, data processing) may be reduced to a minimum needed for basic commands and operation. Power (e.g., PoE, FMP, ESP) may be minimized per port (e.g., power switched from ESP or FMP to PoE, PoE power level lowered) to reduce heat created from power circuits within the network device. One or more of the cables may continue to transmit power (e.g., PoE) for use in critical functions. In one example, the power level per port may be limited (e.g., 45 watt PoE). Power output may be maintained at a level to support auxiliary functions such as PoE lighting, emergency power, control systems, or HVAC. In one example, all functions are minimized and resources are diverted to managed power.

In one or more embodiments, the speed of one or more fans may be minimized or one or more fans may be stopped to limit airflow while monitoring temperature (step 64) to enable small amounts of fan airflow for short periods of time to maintain a low overall system temperature. The fans may operate to allow minimal cooling without impacting MTBF (Mean Time Between Failure) of the equipment while minimizing exposure to particulates pulled through the filter. For example, the protection controller may increase the fan speed of one or more fans when the monitored temperature reaches a specified limit (e.g., predefined or user defined limit). The temperature may be monitored at any suitable location within the network device. The controller may be operable to increase the fan speed if a monitored temperature at the network device exceeds a specified limit (i.e., one or more fans turned on or speed increased) (step 65).

The network device exits the protection mode upon removal of the protective cover from the network device (step 66). The network device may exit protection mode upon detecting removal of the protective cover or receiving a second (exit) command at the network device. The network device increases one or more of the fan speed, the processing functions, or the power to resume normal operation at the network device (step 67). As previously described, the command to exit protection mode may comprise detection of removal of the cover at a sensor or switch or a command received at the controller.

It is to be understood that the process shown in FIG. 6 and described above is only an example and steps may be added, removed, or modified, or the order changed, without departing from the scope of the embodiments.

In one example, the embodiments described herein may operate in the context of a data communications network including multiple network devices. The network may include any number of network devices in communication via any number of nodes (e.g., routers, switches, gateways, controllers, edge devices, access devices, aggregation devices, core nodes, intermediate nodes, or other network devices), which facilitate passage of data over one or more networks. The network devices may communicate over or be in communication with one or more networks, which may include any number or arrangement of network communications devices (e.g., switches, access points, routers, or other devices) operable to route (switch, forward) data communications. The network device may comprise, for example, a router, switch, or other network device, which may communicate over one or more networks (e.g., local area network (LAN), metropolitan area network (MAN), wide area network (WAN), virtual private network (VPN) (e.g., Ethernet virtual private network (EVPN), layer 2 virtual private network (L2VPN)), virtual local area network (VLAN), wireless network, enterprise network, corporate network, data center, Internet, intranet, radio access network, public switched network, or any other network). As previously noted, the protection covers may also be used on other types of electronic equipment, which may not include data communications.

Figure 7:
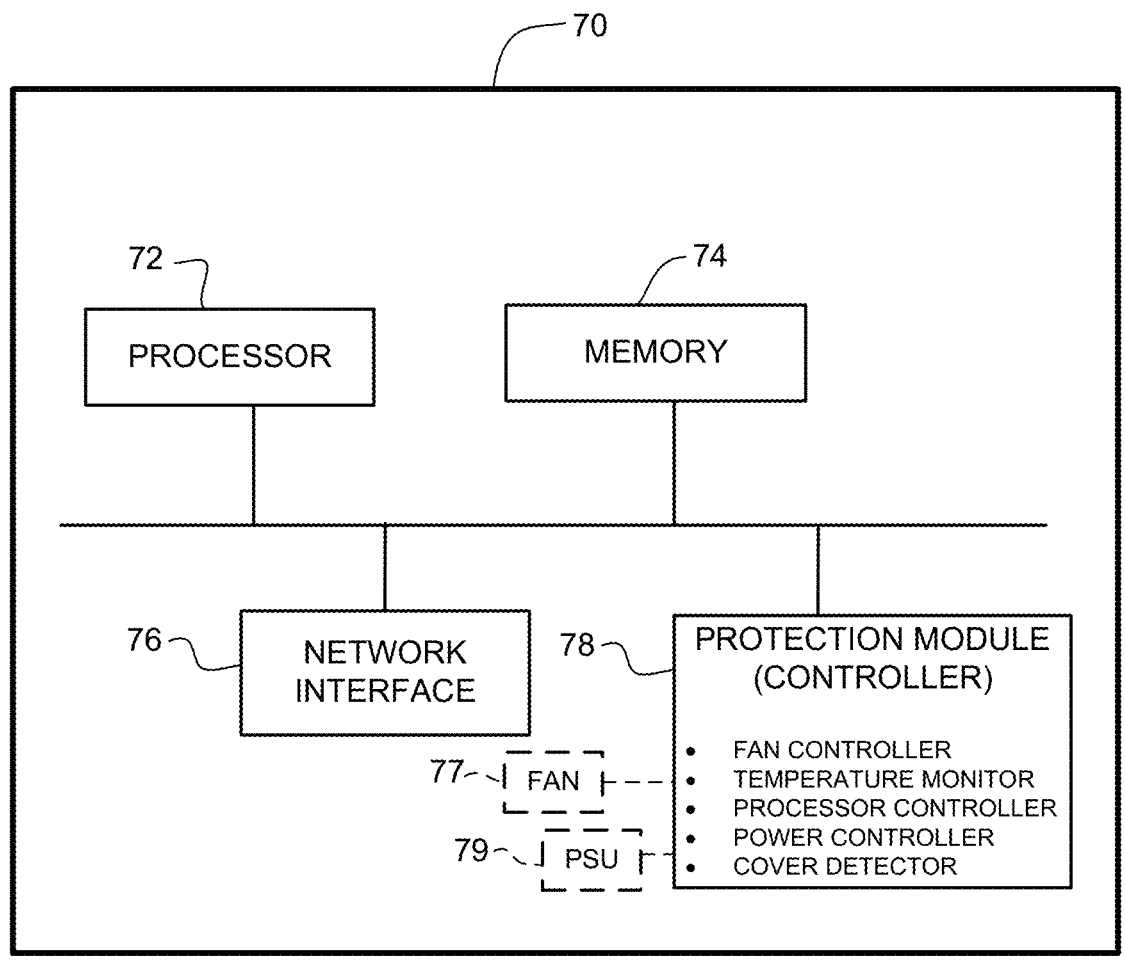
FIG. 7 depicts an example of a network device that may be used to implement embodiments described herein.

FIG. 7 illustrates an example of a network device 70 that may implement the embodiments described herein. In one or more embodiments, the network device 70 is a programmable machine that may be implemented in hardware, software, or any combination thereof. The network device 70 includes one or more processor 72, memory 74, network interface (port) 76, and protection module (controller) 78 (e.g., fan controller, temperature monitor, processor controller, power controller, cover detector). The controller 78 may comprise, for example, software, firmware, logic, or other modules or components operable to control fan speed, processing functions, and power output. As previously noted, the network device 70 may include one or more fans 77 for providing flow of cooling air through the network device and one or more power supply units (PSUs) 79. In one or more embodiments, the controller 78 may be configured to perform the process described above with respect to FIG. 6.

Memory 74 may be a volatile memory or non-volatile storage, which stores various applications, operating systems, modules, and data for execution and use by the processor 72. Memory 74 may include one or more of the components (e.g., software, logic) of the controller 78. The network device 70 may include any number of memory components.

Logic may be encoded in one or more tangible media for execution by the processor 72. For example, the processor 72 may execute codes stored in a computer-readable medium such as memory 74. The computer-readable medium may be, for example, electronic (e.g., RAM (random access memory), ROM (read-only memory), EPROM (erasable programmable read-only memory)), magnetic, optical (e.g., CD, DVD), electromagnetic, semiconductor technology, or any other suitable medium. In one example, the computer-readable medium comprises a non-transitory computer-readable medium. The network device 70 may include any number of processors 72.

The network interface 76 may comprise any number of interfaces (e.g., ports) for receiving or transmitting data or power.

It is to be understood that the network device 70 shown in FIG. 7 and described above is only an example and that different configurations of network devices may be used. For example, the network device 70 may further include any suitable combination of hardware, software, algorithms, processors, devices, components, or elements operable to facilitate the capabilities described herein. Also, as previously noted, it is to be understood that the embodiments described herein may be used in any type of electronic equipment with components that are susceptible to contamination.

Although the method and apparatus have been described in accordance with the embodiments shown, one of ordinary skill in the art will readily recognize that there could be variations made to the embodiments without departing from the scope of the embodiments. Accordingly, it is intended that all matter contained in the above description and shown in the accompanying drawings shall be interpreted as illustrative and not in a limiting sense.

What is claimed is:

1. An apparatus comprising:
a removable protective cover for installation on a face of a network device comprising a plurality of ports coupled to a plurality of cables, the protective cover comprising:
a filter material arranged in a tubular shape defining a first opening at a first end for engagement with the plurality of cables coupled to the network device and a second opening for positioning adjacent to the face of the network device, wherein a size of the first opening is adjustable to engage with the plurality of cables;
wherein the protective cover filters airflow entering the face of the network device during a period of increased environmental contamination with the network device operating in a protection mode with reduced airflow.

2. The apparatus of claim 1, wherein the protective cover comprises a sealable opening extending between said first and second openings for installation and removal of the protective cover with the plurality of cables coupled to the network device.

3. The apparatus of claim 1, wherein the protective cover comprises a side opening for cables exiting towards a side of the network device.

4. The apparatus of claim 1, wherein said first opening comprises a drawstring for tightening the first opening for engagement with the plurality of cables.

5. The apparatus of claim 1, wherein said first opening comprises a device for gathering a portion of the protective cover to seal against the plurality of cables.

6. The apparatus of claim 1, wherein the protective cover comprises a sensor interface operable to indicate to a sensor located on the network device installation or removal of the protective cover.

7. The apparatus of claim 1, wherein a fan speed, processing functions, and power are reduced at the network device while operating in said protection mode.

8. The apparatus of claim 1, further comprising an air inlet cover for mounting on an air inlet side of the network device.

9. A protective cover comprising:
a filter material arranged in a tubular shape with a first opening for sealing against one or more cables coupled to a network device and a second opening for positioning adjacent to a face of the network device, wherein a size of the first opening is adjustable to engage with the one or more cables; and
a device for sealing the first opening against the one or more cables.

10. The protective cover of claim 9, further comprising:
a sealable opening extending between the first opening and the second opening for installation and removal of the protective cover when the one or more cables are coupled to the network device.

11. The protective cover of claim 9, further comprising:
a side opening to allow the one or more cables to exit a side of the network device.

12. The protective cover of claim 9, wherein the device includes a drawstring for tightening the first opening against the one or more cables.

13. The protective cover of claim 9, further comprising:
a sensor interface operable to indicate to a sensor located on the network device installation or removal of the protective cover.

14. The protective cover of claim 9, wherein installation of the protective cover causes the network device to operate in a protection mode with reduced airflow.

15. The protective cover of claim 9, further comprising:
a dust barrier adjacent the first opening, the dust barrier including a flexible strip attached to an inner edge of the protective cover with thin flexible fingers to filter out contaminants.

16. An apparatus comprising:
a protective cover for temporarily filtering airflow entering a network device during a period of increased contamination, the protective cover including:
a filter material arranged in a tubular shape with a first opening and a second opening, a size of the first opening being adjustable to engage with one or more cables passing through the protective cover, and the second opening being positioned adjacent a face of the network device comprising a plurality of ports coupled to the one or more cables.

17. The apparatus of claim 16, wherein the protective cover further comprises a device to seal the first opening against the one or more cables.

18. The apparatus of claim 17, wherein the device includes a drawstring for tightening the first opening against the one or more cables.

19. The apparatus of claim 16, wherein installation of the protective cover on the network device causes the network device to operate in a protection mode with reduced airflow.

20. The apparatus of claim 16, wherein the protective cover further comprises:
a sensor interface operable to indicate to a sensor located on the network device installation or removal of the protective cover.

* * * * *